(12) United States Patent
Moon et al.

(10) Patent No.: US 11,876,143 B2
(45) Date of Patent: Jan. 16, 2024

(54) TERAHERTZ LIGHT SOURCE DEVICE

(71) Applicant: ELECTRONICS AND TELECOMMUNICATIONS RESEARCH INSTITUTE, Daejeon (KR)

(72) Inventors: Kiwon Moon, Daejeon (KR); Kyung Hyun Park, Daejeon (KR); Dong Woo Park, Sejong-si (KR); Jun-Hwan Shin, Daejeon (KR); Eui Su Lee, Sejong-si (KR); Hyun Soo Kim, Daejeon (KR); Il Min Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 162 days.

(21) Appl. No.: 17/513,805

(22) Filed: Oct. 28, 2021

(65) Prior Publication Data

US 2022/0140170 A1 May 5, 2022

(30) Foreign Application Priority Data

Oct. 29, 2020 (KR) .................. 10-2020-0141680

(51) Int. Cl.
| | |
|---|---|
| *H01L 31/102* | (2006.01) |
| *H01L 29/88* | (2006.01) |
| *H01L 31/0304* | (2006.01) |
| *G02F 2/02* | (2006.01) |
| *H03B 7/08* | (2006.01) |

(52) U.S. Cl.
CPC .............. *H01L 31/102* (2013.01); *G02F 2/02* (2013.01); *H01L 29/882* (2013.01); *H01L 31/03048* (2013.01); *H03B 7/08* (2013.01); *G02F 2203/13* (2013.01)

(58) Field of Classification Search
CPC ............ H01L 31/102; H01L 31/03048; H01L 29/882; H01L 29/205
See application file for complete search history.

(56) References Cited

U.S. PATENT DOCUMENTS

| | | | |
|---|---|---|---|
| 9,761,750 B2 | 9/2017 | Moon et al. | |
| 10,082,627 B2 | 9/2018 | Park et al. | |
| 10,276,919 B2 | 4/2019 | Diebold et al. | |
| 2016/0344343 A1* | 11/2016 | Feiginov | H03B 7/08 |
| 2017/0250458 A1* | 8/2017 | Diebold | H01Q 9/28 |
| 2019/0027644 A1* | 1/2019 | Brown | H01S 5/34333 |

FOREIGN PATENT DOCUMENTS

JP 2017157907 A 9/2017

* cited by examiner

*Primary Examiner* — Calvin Y Choi
(74) *Attorney, Agent, or Firm* — Rabin & Berdo, P.C.

(57) ABSTRACT

Provided is a terahertz light source device including an antenna, a plurality of wire electrodes configured to connect the antenna to a power source, a capacitor connected to the wire electrodes between the antenna and the power source, and a plurality of resonance tunneling diodes connected to the wire electrodes between the capacitor and the antenna, and configured to generate a terahertz wave by coupling with the capacitor as a parallel resonance circuit with respect to the power source.

11 Claims, 5 Drawing Sheets

TERAHERTZ LIGHT SOURCE DEVICE

CROSS-REFERENCE TO RELATED APPLICATIONS

This U.S. non-provisional patent application claims priority under 35 U.S.C. § 119 of Korean Patent Application No. 10-2020-0141680, filed on Oct. 29, 2020, the entire contents of which are hereby incorporated by reference.

BACKGROUND

The present disclosure herein relates to a light source device, and more particularly, to a terahertz light source device.

In general, terahertz waves provide different characteristics from existing single photoelectromagnetic waves in various fields such as communication, spectroscopy, and imaging, so that they may be used in various application technologies such as high-speed communication, identification of dangerous substances and transparent images. In particular, studies on a resonant tunneling diode (RTD) as a device capable of generating a high-output terahertz wave through a single device are being actively conducted. The RTD is a diode made to have a negative resistance value in a portion of the current-voltage curve of a device through a special quantum structure by using a tunneling effect in which electrons in a semiconductor pass through a thin quantum barrier.

SUMMARY

The present disclosure provides a terahertz light source device capable of increasing the output of a terahertz wave.

The present disclosure also provides a terahertz light source device capable of generating a frequency comb of terahertz waves.

An embodiment of the inventive concept provides a terahertz light source device including: an antenna; a plurality of wire electrodes configured to connect the antenna to a power source; a capacitor connected to the wire electrodes between the antenna and the power source; and a plurality of resonance tunneling diodes connected to the wire electrodes between the capacitor and the antenna, and configured to generate a terahertz wave by coupling with the capacitor as a parallel resonance circuit with respect to the power source, wherein the capacitor is disposed within a reference distance with any one of the resonance tunneling diodes, wherein each of the resonance tunneling diodes is arranged at each separation distance equal to the reference distance.

In an embodiment, the number of resonance tunneling diodes may be 5 and more.

In an embodiment, the terahertz light source device may further include a resistance element connected to the wire electrodes between the resonance tunneling diodes.

In an embodiment, each of the reference distance and the separation distance may be 70 μm.

In an embodiment, the distances between adjacent resonance elements may be varied for the resonance frequency of the different resonance elements can be varied, and the resonance frequency differences between two adjacent elements are approximately equal.

In an embodiment, each of the resonance tunneling diodes may include: a substrate; a first doped layer disposed on the substrate; a first barrier layer disposed on one side of the first doped layer; a well layer disposed on the first barrier layer; a second barrier layer disposed on the well layer; and a second doped layer disposed on the second barrier layer.

In an embodiment, the wire electrodes may include: a first wire electrode disposed on the other side of the first doped layer; and a second wire electrode disposed on the second doped layer, wherein the first and second wire electrodes have a characteristic impedance of 90Ω.

In an embodiment, one side of the first doped layer, the first barrier layer, the well layer, the second barrier layer, and the second doped layer may form a mesa structure.

In an embodiment, the mesa structure may have a square shape, wherein one side of the square may have a length of 0.77 μm.

In an embodiment, each of the first and second barrier layers may have a thickness of 2 nm or less.

In an embodiment, each of the first and second barrier layers may include aluminum gallium nitride.

In an embodiment, the well layer may have a thickness of 3 nm to 4 nm.

DETAILED DESCRIPTION

Hereinafter, preferred embodiments of the inventive concept will be described in detail with reference to the accompanying drawings. Advantages and features of the inventive concept, and a method of achieving them, will become apparent with reference to the embodiments described below in detail in conjunction with the accompanying drawings. However, the inventive concept is not limited to the embodiments described herein, and may be embodied in different forms. Rather, the embodiments introduced herein are provided so that this disclosure may be thorough and complete and the spirit of the inventive concept may be sufficiently conveyed to those skilled in the art, and the inventive concept is only defined by the scope of the claims. Like reference numerals refer to like elements throughout the specification.

The terms used in this specification are for describing embodiments and are not intended to limit the inventive concept. In this specification, the singular form also includes the plural form unless specifically stated in the phrase. As used in the specification, in relation to 'comprises' and/or 'comprising', the mentioned elements, steps, operations and/or elements do not exclude the presence or addition of one or more other elements, steps, operations and/or elements. In addition, since this is according to a preferred embodiment, reference signs provided in the order of description are not necessarily limited to the order.

Further, the embodiments described herein will be described with reference to cross-sectional and/or plan views, which are ideal illustrative views of the inventive concept. In the drawings, thicknesses of films and regions are exaggerated for effective description of technical content. Accordingly, the shape of the illustrative drawing may be modified due to manufacturing technology and/or tolerance. Accordingly, the embodiments of the inventive concept are not limited to the specific form shown, but also include changes in the form generated according to the manufacturing process.

Figure 1:
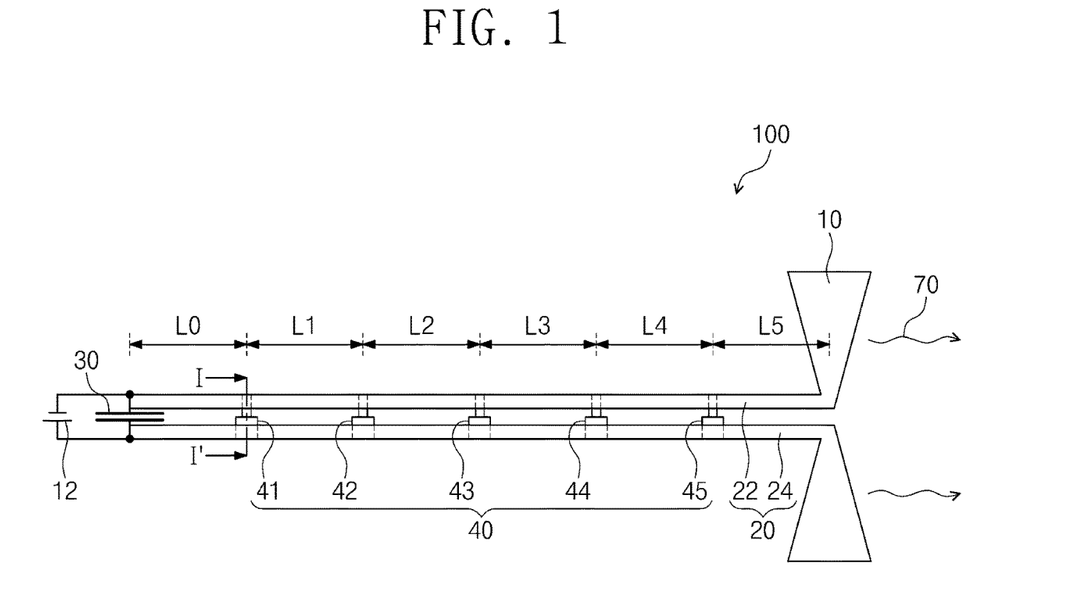
FIG. 1 is a plan view showing an example of a terahertz light source device according to the inventive concept.

FIG. 1 shows an example of a terahertz light source device 100 according to the inventive concept.

Referring to FIG. 1, a terahertz light source device 100 of the inventive concept may include an antenna 10, a plurality of wire electrodes 20, a capacitor 30, and resonance tunneling diodes 40.

The antenna 10 may transmit the terahertz wave 70 in free space (e.g., in the air). The antenna 10 may have a bow tie type. For example, the terahertz wave 70 may have a frequency of about 300 GHz to about 500 GHz, but the inventive concept is not limited thereto.

The plurality of wire electrodes 20 may connect the antenna 10 to the power source 12. The power source 12 may include a DC power source. Alternatively, the power source 12 may include an AC power source, but the inventive concept is not limited thereto. For example, the plurality of wire electrodes 20 may include Coplanar Stripline (CPS). The plurality of wire electrodes 20 may have a characteristic impedance of about 90Ω. For example, the plurality of wire electrodes 20 may include a first wire electrode 22 and a second wire electrode 24. The first wire electrode 22 may be connected to one terminal of the antenna 10, and the second wire electrode 24 may be connected to the other terminal of the antenna 10.

The capacitor 30 may be connected in parallel to the antenna 10 by the plurality of wire electrodes 20. The first wire electrode 22 may connect one terminal of the capacitor 30 to one terminal of the antenna 10, and the second wire electrode 24 may connect the other terminal of the capacitor 30 to the other terminal of the antenna 10. The capacitor 30 may be a shunt capacitor or a parallel capacitor.

The resonance tunneling diodes 40 may be connected in parallel along the first wire electrode 22 and the second wire electrode 24 between the capacitor 30 and the antenna 10. For example, the number of resonance tunneling diodes 40 may be five. The number of resonance tunneling diodes 40 may be ten, and the inventive concept is not limited thereto. For example, the resonance tunneling diodes 40 may include first to fifth resonance tunneling diodes 41, 42, 43, 44, and 45.

The first resonance tunneling diode 41 may be disposed adjacent to the capacitor 30 and may be disposed at a reference distance L0 from the capacitor 30. The first to fifth resonance tunneling diodes 41, 42, 43, 44, and 45 may be disposed at separation distances equal to the reference distance L0. The second resonance tunneling diode 42 may be disposed at a first separation distance L1 from the first resonance tunneling diode 41. The first separation distance L1 may be equal to the reference distance L0. The third resonance tunneling diode 43 may be disposed at a second separation distance L2 from the second resonance tunneling diode 42. The fourth resonance tunneling diode 44 may be disposed at a third separation distance L3 from the third resonance tunneling diode 43. The fifth resonance tunneling diode 45 may be disposed adjacent to the antenna 10, and may be disposed within a fourth separation distance L4 from the fourth resonance tunneling diode 44. For example, each of the first to fourth separation distances L1, L2, L3, and L4 may be equal to the reference distance L0. For example, each of the reference distance L0 and the first to fourth separation distances L1, L2, L3, and L4 may be about 70 μm. The first to fifth tunneling diodes 41, 42, 43, 44, and 45 at equal intervals may increase the output power of the terahertz wave 70 by using constructive interference. When the first to fourth separation distances L1, L2, L3, and L4 may be different from each other, a frequency comb 72 of the terahertz wave 70 is generated.

Although not shown in the drawing, the first to fourth separation distances L1, L2, L3, and L4 may be gradually increased or decreased, and may be arbitrarily set, and the inventive concept is not limited thereto. In addition, the resonance tunneling diodes 40 may further include sixth to n-th resonance tunneling diodes, and the sixth to n-th resonance tunneling diodes may be disposed at sixth to (n−1)-th separation distances equal to the reference distance L0.

When the power source 12 provides the power source voltage to both terminals of the capacitor 30, the resonance tunneling diodes 40 may be coupled to the capacitor 30 as a parallel LC resonance circuit or operate to generate the terahertz wave 70. The power source voltage may be a DC voltage or an AC voltage. For example, the terahertz wave 70 may have a resonant frequency of about 0.1 THz to about 5 THz. The output power of the terahertz wave 70 may increase in proportion to the input power of the power source voltage. The resonant frequency may be a frequency without internal loss of the terahertz wave 70. As in Equation 1, the resonant frequency may be determined by the effective inductance seen by the RTD element and capacitance of the RTD mesa structure.

$$f_o = \frac{1}{2\pi\sqrt{LC_n}} \quad \text{[Equation 1]}$$

$f_o$ may be a resonant frequency, L may be an effective inductance, and $C_n$ may be a capacitance of each of the resonance tunneling diodes 40. The resonant frequency $f_o$ may be inversely proportional to the product of the effective inductance L and the capacitances $C_n$.

The effective inductance L may be determined according to Equation (2), or other RF numerical calculation methods.

$$j\omega L = jZ_o \tan(\beta l) \quad \text{[Equation 2]}$$

j may be an imaginary number. w is an angular frequency, and the angular frequency w may be calculated as $2\pi f$. $Z_0$ may be a characteristic impedance of the wire electrodes 20, β may be a propagation constant, and l may be a distance between the capacitor 30 and the first resonance tunneling diode 41, or a distance between Ln and Ln+1. Accordingly, the reactance L may be proportional to the characteristic impedance $Z_0$ of the wire electrodes 20 and the distance l between the capacitor 30 and the first resonance tunneling diode 41. The distance l between the capacitor 30 and the first resonance tunneling diode 41 may correspond to the reference distance L0.

Because of the differences in length of L0~L5, the resonance frequency of the RTD elements (41~45) may be different. With proper design, the resonance frequency differences between adjacent to elements can be approximately equal.

Referring back to Equation 1, the resonant frequency $f_0$ may be inversely proportional to the capacitance $C_n$ of each of the resonance tunneling diodes 40, and the capacitance $C_n$ may be proportional to the area of each of the resonance tunneling diodes 40.

Figure 2:
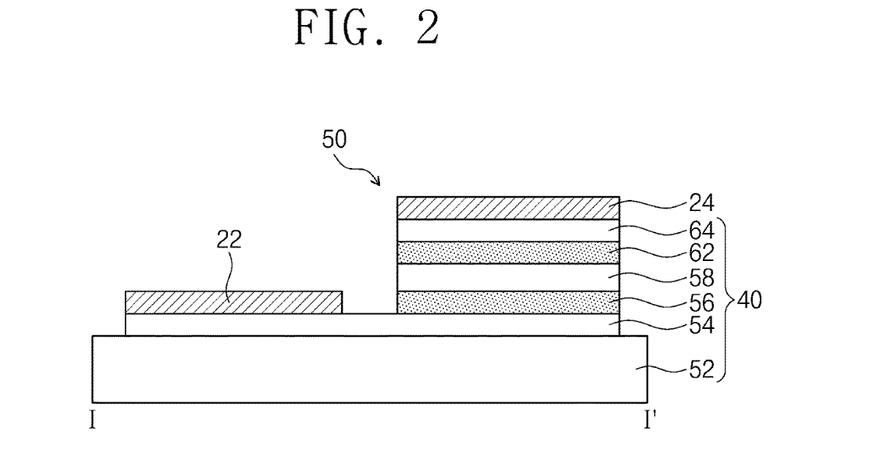
FIG. 2 is a cross-sectional view showing an example of resonance tunneling diodes of FIG. 1.

FIG. 2 shows an example of the resonance tunneling diodes 40 of FIG. 1.

Referring to FIG. 2, each of the resonance tunneling diodes 40 may include a substrate 52, a first doped layer 54, a first barrier layer 56, a well layer 58, a second barrier layer 62, and a second doped layer 64.

The substrate 52 may include an indium phosphide (InP) substrate, a silicon (Si) substrate, or a gallium arsenide (GaAs) substrate. The inventive concept is not limited thereto.

The first doped layer 54 may be disposed on the substrate 32. The first doped layer 34 may have a first conductivity type. For example, the first doped layer 54 may have an n-type. The first doped layer 54 may include a group III-V semiconductor of GaAs or InP. The first wire electrode 22 may be disposed on one side of the first doped layer 54. The other side of the first doped layer 54, the barrier layer 56, the well layer 58, the second barrier layer 62, and the second doped layer 64 may form a mesa structure 50. Although not shown in the drawing, the other side of the first doped layer 54 of the mesa structure 60, the barrier layer 56, the well layer 58, the second barrier layer 62, and the second doped layer 64 may have a square shape in a plan view. The length of one side of the square of the mesa structure 60 may be about 0.1 μm to about 5.0 μm.

The first barrier layer 56 may be disposed on the other side of the first doped layer 34. For example, the first barrier layer 56 may include aluminum arsenide (AlAs). The first barrier layer 56 may have a thickness of about 2 nm or less.

A well layer 58 may be disposed on the first barrier layer 56. For example, the well layer 58 may include InGAAs or InAlGaAs. The well layer 58 may have a thickness of about 2 nm to about 4 nm. The well layer 58 may have a plurality of quantum energy levels.

A second barrier layer 62 may be disposed on the well layer 58. The second barrier layer 62 may include aluminum arsenide (AlAs). The second barrier layer 62 may have a thickness of about 2 nm or less.

A second doped layer 64 may be disposed on the second barrier layer 62. For example, the second doped layer 64 may have a second conductivity type. The second conductivity type may be an n-type. The second doped layer 64 may include a group III-V semiconductor of GaAs or InP. The second wire electrode 24 may be disposed on the second doped layer 64. The first doped layer 54 and the second doped layer 64 may act and/or function as plate electrodes of the capacitor, and the first barrier layer 56, the well layer 58, and the second barrier layer 62 may act and/or function as a dielectric of the capacitor.

Accordingly, each of the resonance tunneling diodes 40 may have a capacitance $C_n$. In addition, the capacitance $C_n$ of each of the resonance tunneling diodes 40 may be proportional to the planar area of the mesa structure 50 of the first doped layer 54 and the second doped layer 64, and may be proportional to the permittivity of the first barrier layer 46, the well layer 48, and the second barrier layer 62, and may be inversely proportional to the thickness of the first barrier layer 46, the well layer 48, and the second barrier layer 62.

Figure 3:
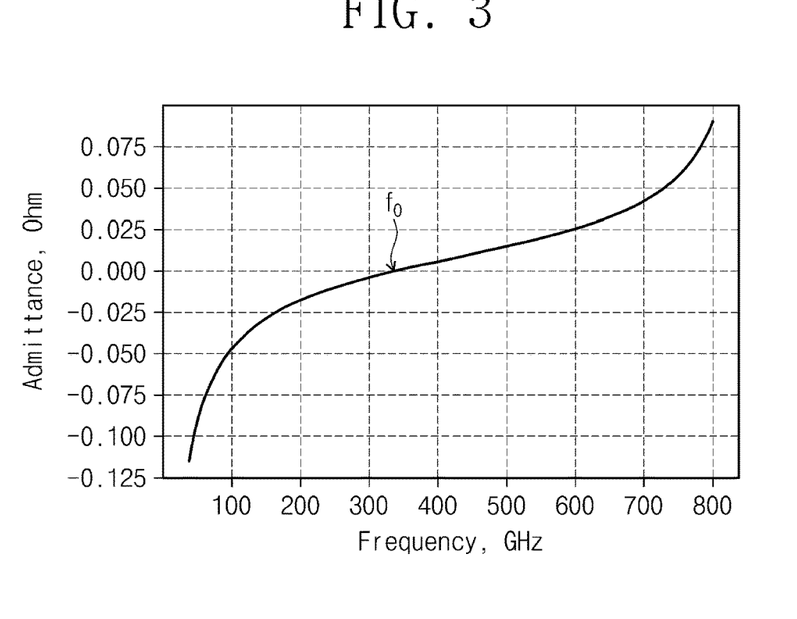
FIG. 3 is a graph showing an imaginary number part according to a frequency of a terahertz wave generated by the resonance tunneling diodes of FIG. 1.

FIG. 3 shows an imaginary number part according to a frequency of a terahertz wave 70 generated by the resonance tunneling diodes 40 of FIG. 1.

Referring to FIG. 3, when the imaginary number part of the terahertz wave 70 is 0, the terahertz wave 70 may have a resonant frequency $f_0$. The resonant frequency $f_0$ may be 350 GHz. The resonance tunneling diodes 40 may generate a terahertz wave 70 having a resonant frequency $f_0$ of about 350 GHz. The wire electrodes 20 may have a characteristic impedance $Z_0$ of about 90Ω, and each of the first to fifth resonance tunneling diodes 41, 42, 43, 44, and 45 may have a capacitance $C_n$ of about 3.82 pf.

By using non-equal Ln's in the array structure, fn of n'th RTD elements may be equally spaced, covering a broad emission bandwidth. Through the frequency mixing effect by the nonlinear I-V characteristic of the RTD element, the frequency difference between, for example, fn and fn−1 can be mode-locked to a characteristic value, for all n's. In the mode-locked operation, n can exceed the number of RTD elements (5 in FIG. 1) in the array device.

When the area of the mesa structure of a typical single resonance tunneling diode is increased by 5 times, a typical single resonance tunneling diode may generate a terahertz wave with a resonant frequency of about 134 GHz. The difference in the change of the resonant frequency of a typical single resonance tunneling diode according to the increase in the area of the mesa structure may be about 166 GHz. A typical single resonance tunneling diode may have a difference in change in resonant frequency greater than a difference in change of the resonant frequency $f_0$ of the equally spaced resonance tunneling diodes 40 connected in parallel. In addition, a typical single resonance tunneling diode may cause breakdown and/or damage of an element due to current concentration and heat generation as its area increases.

Accordingly, the equally spaced resonance tunneling diodes 40 may reduce the difference in change of the frequency $f_0$ and increase the output power according to the input power, compared to a typical single resonance tunneling diode.

Figure 4:
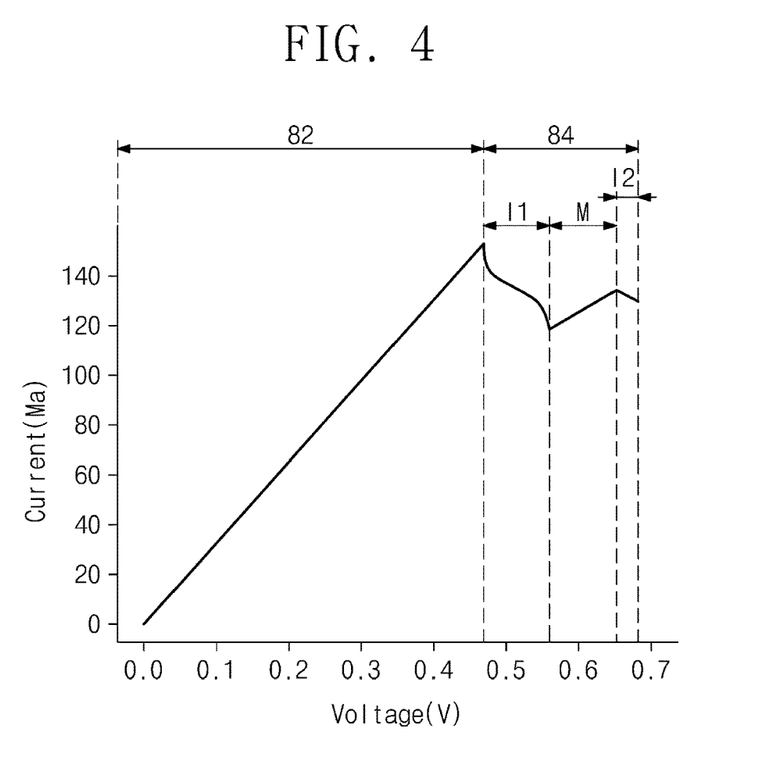
FIG. 4 is a graph showing current-voltage characteristics of resonance tunneling diodes according to the voltage of the power source of FIG. 1.
Figure 5:
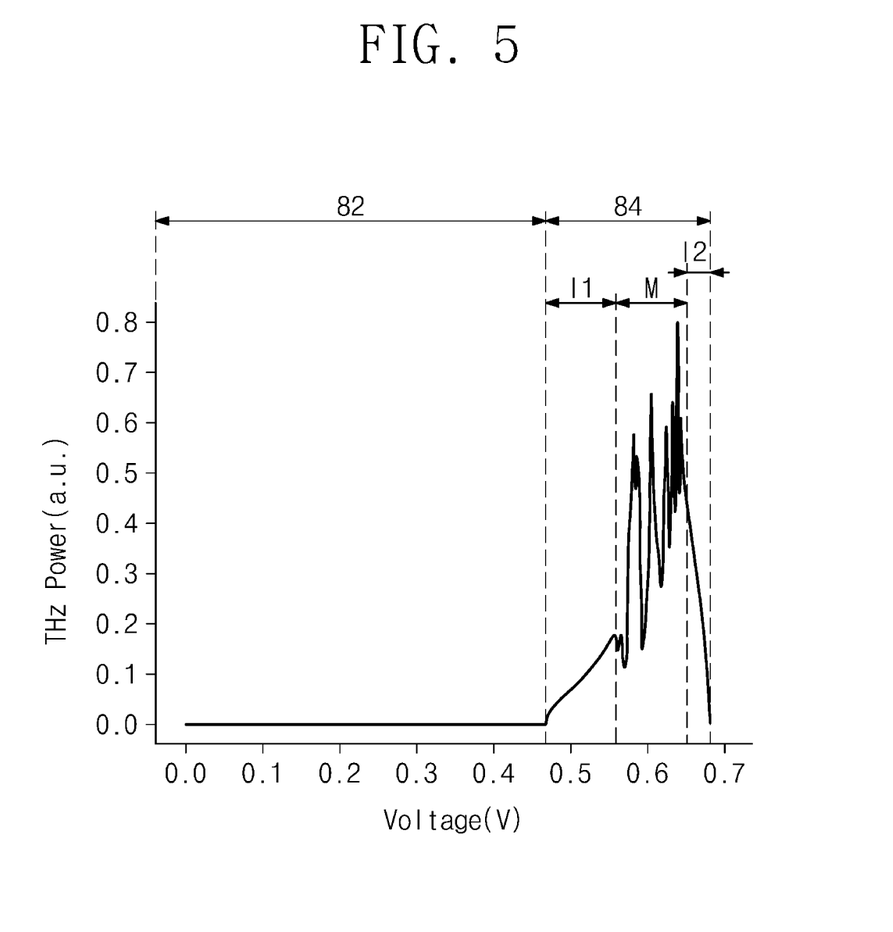
FIG. 5 is a graph showing the power of a terahertz wave according to the voltage of the power source of FIG. 1.

FIG. 4 shows current-voltage (I-V) characteristics of the resonance tunneling diodes 40 according to the voltage of the power source 12 of FIG. 1. FIG. 5 shows the power of the terahertz wave 70 according to the voltage of the power source 12 of FIG. 1.

Referring to FIGS. 4 and 5, when a voltage of about 0.47V or more is provided from the power source 12, the resonance tunneling diodes 40 may have a negative resistance section 84. The negative resistance section 84 may be a decreasing section in which the current flowing through the resonance tunneling diodes 40 is inversely proportional to the power source voltage. When a voltage (e.g., greater than 0.47V) in the negative resistance section 84 is provided, the resonance tunneling diodes 40 may generate a terahertz wave 70. As an example, the negative resistance section 84 may include a first incoherent region I1, a mode-locked region M, and a second incoherent region I2. The terahertz wave 70 of the first incoherent region I1 and the second incoherent region I2 may be used for image signal processing for removing noise. The terahertz wave 70 of the mode-locked region M may be used as a high-frequency light source applied to image signal processing and communication signal processing to remove noise.

If the power source 12 provided a voltage of about 0.47V or less, it may have a positive resistance section 82 for that voltage. The resonance tunneling diodes 40 may have a positive resistance section 82. The positive resistance section 82 may be a decreasing section in which the current flowing through the resonance tunneling diodes 40 is proportional to the power source voltage. The terahertz wave 70 may not be output from the positive resistance section 82 of the resonance tunneling diodes 40.

Figure 6:
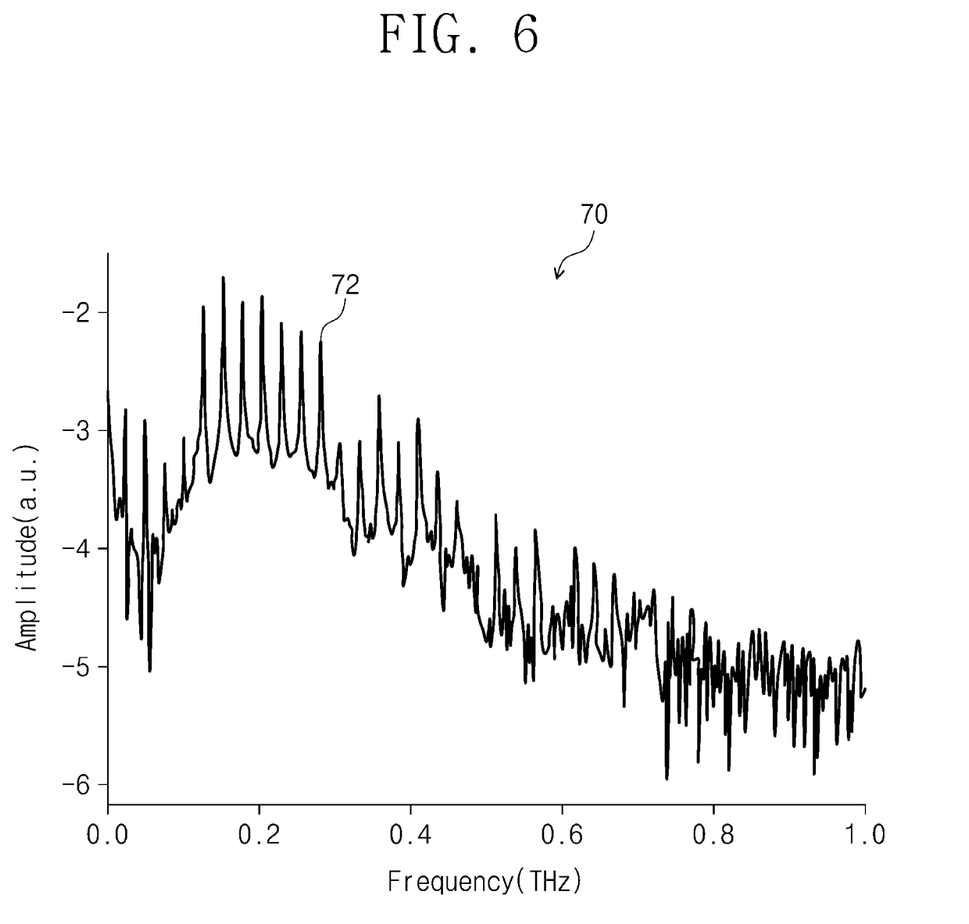
FIG. 6 is a graph showing a emission spectrum of the power source of FIG. 1, showing frequency comb of a terahertz wave output through the first to fifth resonance tunneling diodes of FIG. 1.

FIG. 6 shows the frequency comb 72 of the terahertz wave 70 output through the first to fifth resonance tunneling diodes 41 to 45 of FIG. 1.

Referring to FIG. 6, the first to fifth resonance tunneling diodes 41 to 45 could generate a terahertz wave 70 having the frequency comb 72. The frequency comb 72 may be multi-peaks appearing at a frequency of about 1 THz or less.

Although not shown in the drawing, the frequency comb 72 of the terahertz wave 70 could be generated from 6 to 100 resonance tunneling diodes 40. When the number of resonance tunneling diodes 40 is increased, the distance between the multi-peaks of the frequency comb 72 could be decreased.

Figure 7:
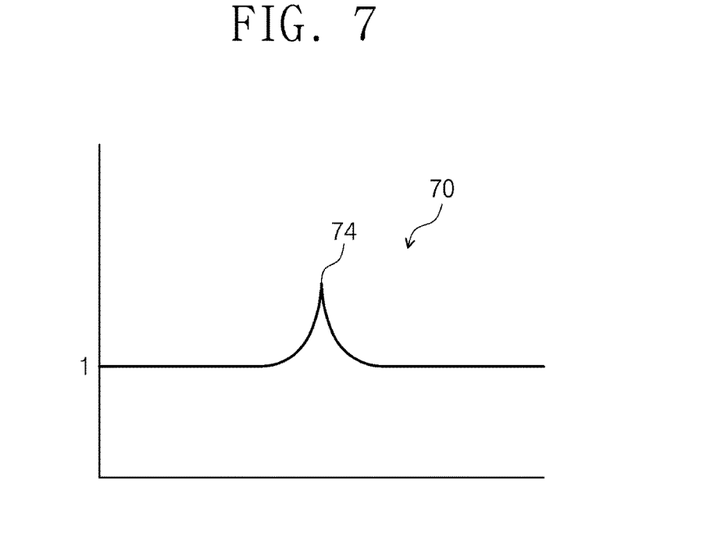
FIG. 7 is a graph showing a single peak generated by first to fourth resonance tunneling diodes.

FIG. 7 shows a single peak 74 generated by the first to fourth resonance tunneling diodes 41 to 44.

Referring to FIG. 7, the first to fourth resonance tunneling diodes 41 to 44 could generate a terahertz wave 70 having a single peak 74 without the use of the fifth resonance tunneling diode 45. Also, the first resonance tunneling diode 41 could generate the terahertz wave 70 having a single peak 74 without the use of the second to fifth resonance tunneling diodes 42 to 45. The first and second resonance tunneling diodes 41 and 42 could generate a terahertz wave 70 with a single peak 74 without the use of the third to fifth resonance tunneling diodes 43 to 45. Likewise, the first and second resonance tunneling diodes 41 to 43 could generate a terahertz wave 70 having a single peak 74 without the use of the fourth and fifth resonance tunneling diodes 44 and 45.

As a result, no more than four resonance tunneling diodes 40 could generate a single peak 74 terahertz wave 70, or five or more resonance tunneling diodes 40 could generate a terahertz wave 70 of a frequency comb 72 forming more than ten peaks.

Figure 8:
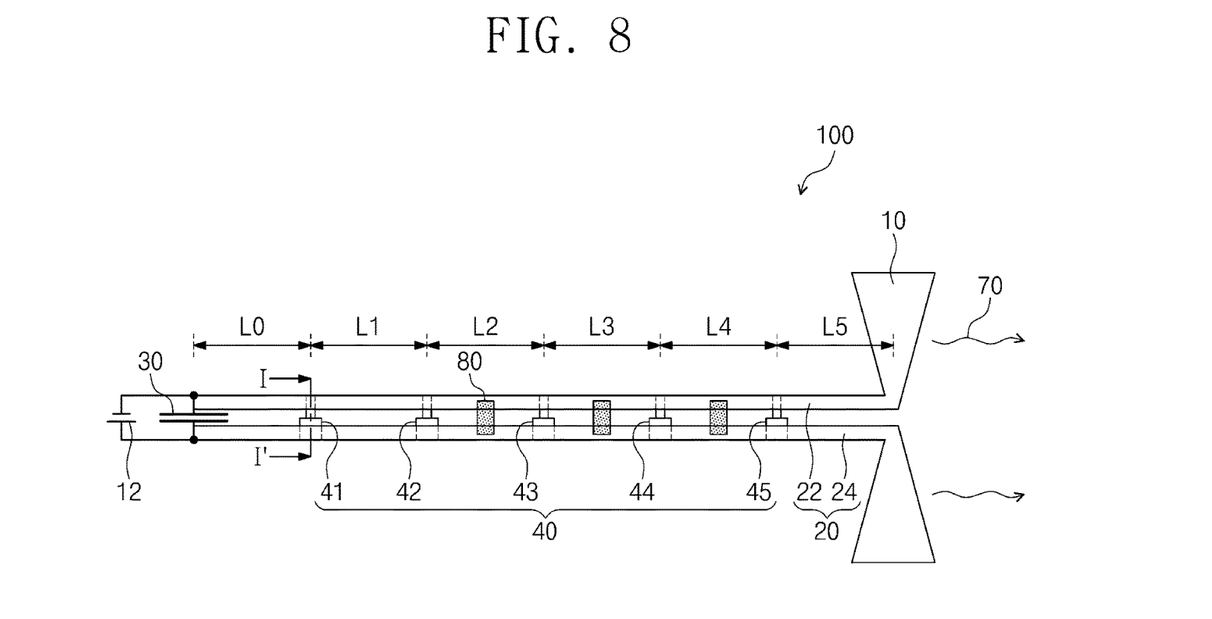
FIG. 8 is a plan view showing an example of a terahertz light source device according to the inventive concept.

FIG. 8 shows an example of a terahertz light source device 100 according to the inventive concept.

Referring to FIG. 8, the terahertz light source device 100 of the inventive concept may further include a resistance element 80 between the resonance tunneling diodes 40. The resistance element 80 may adjust the strength of the frequency comb 72 by compensating for a negative resistance value in the negative resistance section 84 of the resonance tunneling diodes 40. The antenna 10, the wire electrodes 20, and the capacitor 30 may be configured in the same manner as in FIG. 1.

As mentioned above, the terahertz light source device according to an embodiment of the inventive concept may increase the output power of the terahertz wave and generate a frequency comb of the terahertz wave by using five or more resonance tunneling diodes arranged at the same separation distances between the antenna and the capacitor.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:
1. A terahertz light source device comprising:
an antenna;
a plurality of wire electrodes configured to connect the antenna to a power source;
a capacitor connected to the wire electrodes between the antenna and the power source; and
a plurality of resonance tunneling diodes connected to the wire electrodes between the capacitor and the antenna, and configured to generate a terahertz wave by coupling with the capacitor as a parallel resonance circuit with respect to the power source,
wherein the resonance tunneling diodes comprise:
a first resonance tunneling diode having a reference distance from the capacitor;
a second resonance tunneling diode provided on one side of the first resonance tunneling diode opposite to the capacitor, the second resonance tunneling diode having a first separation distance from the first resonance tunneling diode, the first separation distance being equal to the reference distance; and
a third resonance tunneling diode provided on one side of the second resonance tunneling diode opposite to the first resonance tunneling diode, the third resonance tunneling diode having a second separation distance from the second resonance tunneling diode, and
wherein the second separation distance is equal to the first separation distance to resonate the terahertz wave using a constructive interference.

2. The terahertz light source device of claim 1, wherein the resonance tunneling diodes further comprise:
a fourth resonance tunneling diode provided on one side of the third resonance tunneling diode opposite to the second resonance tunneling diode, the fourth resonance tunneling diode having a third separation distance from the third resonance tunneling diode, the third separation distance being equal to the second separation distance; and
a fifth resonance tunneling diode provided on one side of the fourth resonance tunneling diode opposite to the third resonance tunneling diode, the fifth resonance tunneling diode having a fourth separation distance from the fourth resonance tunneling diode, and
wherein the fourth separation distance is equal to the third separation distance.

3. The terahertz light source device of claim 1, further comprising a resistance element connected to the wire electrodes between the resonance tunneling diodes.

4. The terahertz light source device of claim 1, wherein each of the reference distance and the first through fourth separation distances is 70 µm.

5. The terahertz light source device of claim 1, wherein each of the resonance tunneling diodes comprises:
a substrate;
a first doped layer disposed on the substrate;
a first barrier layer disposed on one side of the first doped layer;
a well layer disposed on the first barrier layer;
a second barrier layer disposed on the well layer; and
a second doped layer disposed on the second barrier layer.

6. The terahertz light source device of claim 5, wherein the wire electrodes comprise:
a first wire electrode disposed on another side of the first doped layer; and
a second wire electrode disposed on the second doped layer,
wherein the first and second wire electrodes have a characteristic impedance of 90Ω.

7. The terahertz light source device of claim 5, wherein one side of the first doped layer, the first barrier layer, the well layer, the second barrier layer, and the second doped layer form a mesa structure.

8. The terahertz light source device of claim 7, wherein the mesa structure has a square shape, and
wherein one side of the square shape has a length of 0.77 μm.

9. The terahertz light source device of claim 5, wherein each of the first and second barrier layers has a thickness of 2 nm or less.

10. The terahertz light source device of claim 5, wherein each of the first and second barrier layers comprises aluminum gallium nitride.

11. The terahertz light source device of claim 5, wherein the well layer has a thickness of 3 nm to 4 nm.

\* \* \* \* \*